United States Patent
Hwang et al.

(10) Patent No.: US 10,094,852 B2
(45) Date of Patent: Oct. 9, 2018

(54) SPRING CONTACT

(71) Applicants: HICON CO., LTD., Gyeonggi-do (KR); Dong Weon Hwang, Seoul (KR); Jae Suk Hwang, Berkeley, CA (US); Jae Baek Hwang, Seoul (KR)

(72) Inventors: Dong Weon Hwang, Seoul (KR); Jae Suk Hwang, Berkeley, CA (US); Jae Baek Hwang, Seoul (KR)

(73) Assignees: HICON CO., LTD., Seongnam-si, Gyeonggi-do (KR); Dong Weon Hwang, Seoul (KR); Jae Suk Hwang, Berkeley, CA (US); Jae Baek Hwang, Seoul (KR)

( * ) Notice: Subject to any disclaimer, the term of this patent is extended or adjusted under 35 U.S.C. 154(b) by 0 days.

(21) Appl. No.: 14/768,012

(22) PCT Filed: Jul. 23, 2013

(86) PCT No.: PCT/KR2013/006586
§ 371 (c)(1),
(2) Date: Aug. 14, 2015

(87) PCT Pub. No.: WO2015/008887
PCT Pub. Date: Jan. 22, 2015

(65) Prior Publication Data
US 2015/0377925 A1  Dec. 31, 2015

(30) Foreign Application Priority Data
Jul. 19, 2013 (KR) .................. 10-2013-0085429

(51) Int. Cl.
*G01R 31/00* (2006.01)
*G01R 1/067* (2006.01)

(52) U.S. Cl.
CPC ..... *G01R 1/06722* (2013.01); *G01R 1/06738* (2013.01)

(58) Field of Classification Search
CPC ............ G01R 1/06716; G01R 1/06722; G01R 1/06738; H01R 13/2414; H01R 13/2421
(Continued)

(56) References Cited

U.S. PATENT DOCUMENTS 6,967,492 B2  11/2005  Tsui et al.
7,862,391 B2   1/2011  Johnston et al.
(Continued)

FOREIGN PATENT DOCUMENTS

GB   2 351 398 A    12/2000
JP   11-162592 A     6/1999
(Continued)

OTHER PUBLICATIONS

Patent translation of Oshima, Hisao JP 2006-266869.*
Japanese Office Action dated Jun. 21, 2016.
Chinese Office Action dated Aug. 8, 2017.

*Primary Examiner* — Jeff Natalini
*Assistant Examiner* — Steven Yeninas
(74) *Attorney, Agent, or Firm* — Rabin & Berdo, P.C.

(57) ABSTRACT

The present invention relates to a spring contact, which is integrally formed by blanking and bending a metal plate member, the spring contact comprising: an upper head portion 32 having an upper tip 31 protruding upward; a spring portion (36) formed by a strip cylindrically bent, the strip extending in a zigzag pattern from an upper connection portion 35 extending downward from the upper head portion 32; a lower head portion 39 extending downward from a lower connection 37 extending from the lower end of the spring portion 36; and a lower tip 40 being provided on the lower end of the lower head portion 39. The present invention is advantageously suitable for manufacturing a fine- (Continued)

pitch spring contact and can improve productivity and reduce manufacturing costs.

7 Claims, 16 Drawing Sheets

(58) Field of Classification Search
USPC ............ 324/754.14, 755.01, 755.04, 755.05, 324/755.06; 439/66, 700, 816, 817, 824, 439/908
See application file for complete search history.

(56) References Cited

U.S. PATENT DOCUMENTS

| 8,231,416 | B2 | 7/2012 | Johnston et al. |
| 8,523,579 | B2 | 9/2013 | Johnston et al. |
| 2005/0110505 | A1 | 5/2005 | Tsui et al. |
| 2009/0075529 | A1 | 3/2009 | Johnston et al. |
| 2011/0039457 | A1 | 2/2011 | Johnston et al. |
| 2012/0282821 | A1 | 11/2012 | Johnston et al. |
| 2013/0012076 | A1 | 1/2013 | Hwang |
| 2014/0253163 | A1* | 9/2014 | Suzuki .............. G01R 1/06733 324/755.05 |

FOREIGN PATENT DOCUMENTS

| JP | 2002-31648 A | 1/2002 |
| JP | 2006-266869 A | 10/2006 |
| JP | 2008-516398 A | 5/2008 |
| JP | 2011-226870 A | 11/2011 |
| KR | 10-1058146 B1 | 5/2011 |
| KR | 10-1154519 B1 | 12/2011 |
| KR | 10-1105655 B1 | 1/2012 |
| KR | 10-1247499 B1 | 4/2013 |
| WO | WO 2006/041807 A1 | 4/2006 |

* cited by examiner (a)

(b)

(c)

US 10,094,852 B2

SPRING CONTACT

TECHNICAL FIELD

The present invention generally relates to a spring contact. More specifically, the present invention relates to a spring contact loaded in a test socket for testing an integrated circuit (IC) to realize an electrical connection between contact ends and leads, such as electrical connection of leads of an IC with a pad of a printed circuit board (PCB), or an electrical connection of a PCB within an electronic appliance such as a personal computer (PC) and a mobile phone with leads of an IC in a central processing unit (CPU), etc.

BACKGROUND ART

As illustrated in FIGS. 1 and 2, a related art spring contact 1 includes an upper contact pin 2, a lower contact pin 4, and a spring 3. The upper contact pin 2 and the lower contact pin 4 are assembled to enable a vertical slide. The upper contact pin 2 and the lower contact pin 4 are elastically supported by the spring 3 therebetween. Thus the upper contact pin 2 applies pressure to a lead of an IC and the lower contact pin 4 applies pressure to a PCB, resulting in electrical contact between the IC and the PCB.

The spring contact electrically connects the PCB with the lead of the IC, and is an essential part of a test socket for testing ICs.

In the related art, minimizing the outer diameter of the spring contact has been problematic. That is, to manufacture a spring contact with an outer diameter of 0.2 mm, the thickness of the spring, and the shape and size of the upper contact pin and the lower contact pin become exceedingly fine. Accordingly, it is difficult to work with and assemble the spring contact using present technology. Therefore, mass production and quality guarantees of the spring contact are difficult to achieve. Furthermore, price of the spring contact increases, thus limiting commercialization thereof.

RELATED ART DOCUMENT

[Patent Document 1] Korean Patent No. 10-1058146 (Registered on Aug. 12, 2011)
[Patent Document 2] Korean Patent No. 10-1154519 (Registered on Jun. 1, 2012)

DISCLOSURE

Technical Problem

To improve problems of the related art, the present invention is intended to propose a fine-pitch spring contact having an outer diameter of 0.2 mm or less and a simple configuration, which is provided in various types and in which the fine pitch is 0.3 mm or less.

Technical Solution

A spring contact according to the present invention is a spring contact integrally formed by blanking and bending a metal plate member, the spring contact including: an upper head portion having an upper tip protruding upward; a spring portion formed by a strip bent in the shape of a cylinder, the spring portion extending in a zigzag pattern from an upper connection portion extending downward from the upper head portion; and a lower head portion extending downward from a lower connection portion extending from the lower end of the spring portion, the lower head portion being provided with a lower tip at the lower end of the lower head portion.

Preferably, the upper head portion and the lower head portion of the present invention are on the same central axis. The spring portion is biased with respect to the central axis C on a plate pattern, the spring portion having the same pitch and the same width. More preferably, the spring portion further includes a core of a linear strip extending from any one of bent joints of the spring portion at least to the lowest end of the upper head portion, the core having a contact end capable of contacting the upper head portion.

Preferably, the core of the present invention is spaced from a cylindrical inner surface of the spring portion. The upper head portion is a hollow tube in shape, with the contact end of the core contacting with the inner surface of the upper head portion. The upper head portion is provided with a contact groove into which the contact end is inserted and thus makes contact with the upper head portion. In this case, the spring contact may further include a ring that protrudes from a neck connecting the upper head portion with the spring portion, the ring wrapping the contact end.

Preferably, according to the present invention, the upper head portion or the connection portion connecting the upper head portion with the spring portion further includes a protruding upper shoulder.

Preferably, according to the present invention, the lower head portion or the connection portion connecting the lower head portion with the spring portion further includes a protruding lower shoulder.

Advantageous Effects

The spring contact of the present invention is a spring contact integrally formed by blanking and bending a metal plate member. The outer diameter of a spring portion of the spring contact can be made smaller so that the spring portion can offer higher elasticity than a conventional spring contact, and manufacture of a fine-pitch spring can be simplified because components of the spring contact are integrated, thus resulting in an increase of productivity and a decrease of production cost.

The spring contact of the present invention further includes a core in a linear strip shape functioning as a conductive path within the spring portion elastically supporting the upper head portion and the lower head portion. Thus, as for the spring contact, it is easy to make an optimized design with appropriate elasticity and required current resistance.

Figure 1:
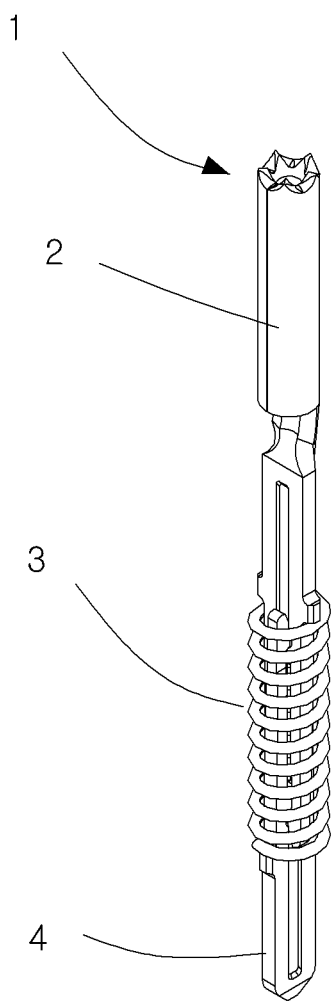
FIG. 1 is a perspective view of a related art spring contact.
Figure 2:
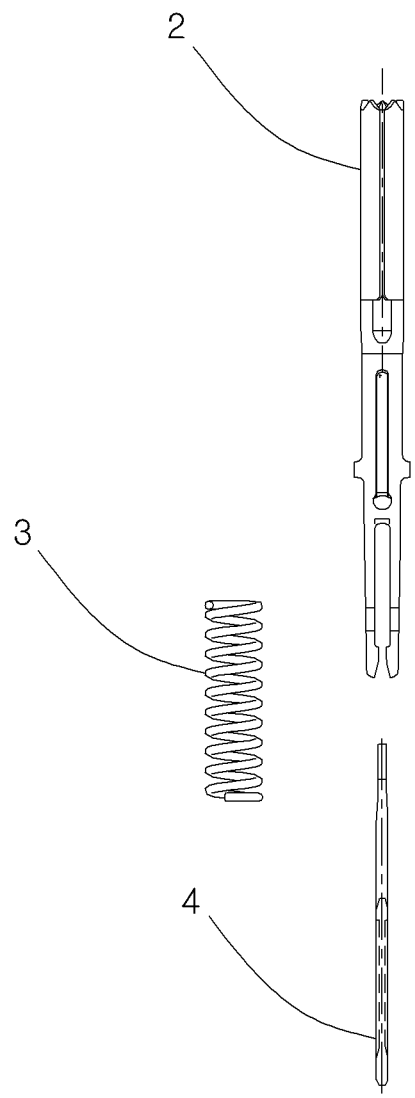
FIG. 2 is an exploded view of the related art spring contact.

DESCRIPTION OF THE REFERENCE NUMERALS IN THE DRAWINGS 12, 32, 52, 72, 92: upper head portion
16, 36, 56, 76, 98: spring portion
19, 39, 59, 79, 101: lower head portion
82, 104: core
83, 105: contact end
93: contact groove
96: ring

BEST MODE

Terms or words used in this specification and claims should not be limited to a meaning in normal practice or a normal dictionary, and should be interpreted in the meaning and concept that corresponds to the spirit of the art of the present invention, based on the principle that an inventor may properly define the concept of terms in order to describe the invention in the best mode.

Accordingly, the embodiments written in the specification and the configuration illustrated in the drawings are only preferred embodiments of the present invention, and so are not to be thought of as limiting the present invention. Thus, it should be appreciated that the present invention may be replaced with a variety of equivalents and variations as of the filing date of the present invention.

Hereinafter, an exemplary embodiment of the present invention is described in detail with reference to the accompanying drawings.

First Embodiment

Figure 3:
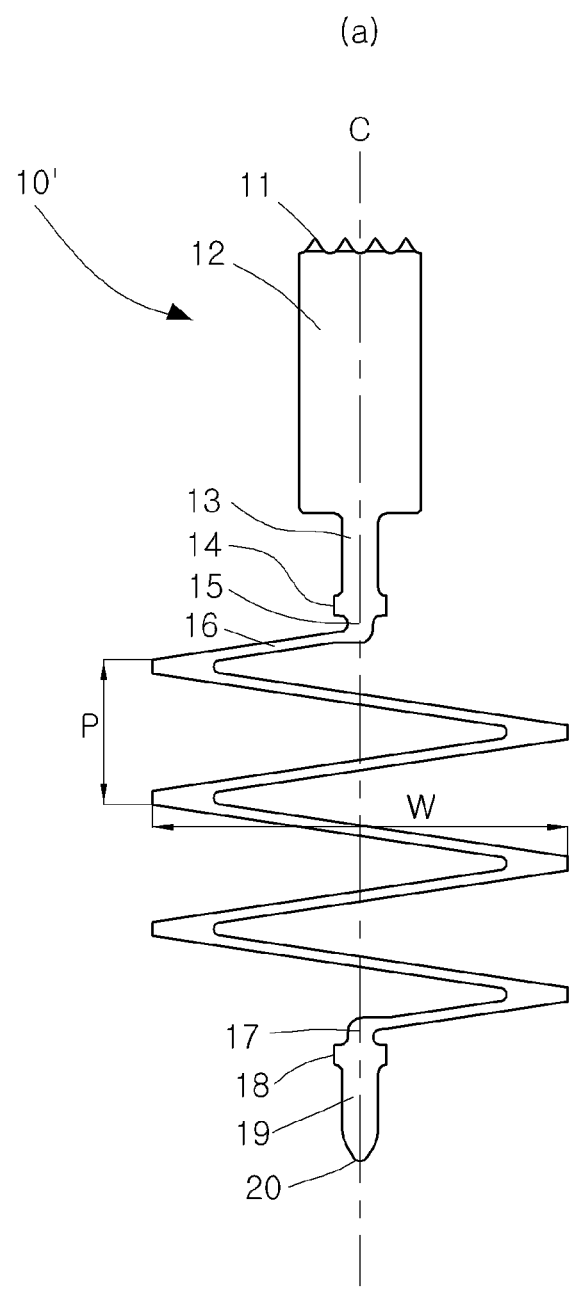
FIG. 3 is a view illustrating a plate pattern of a spring contact before bending according to a first embodiment of the present invention.

FIG. 3 is a view illustrating a plate pattern of a spring contact before bending according to a first embodiment of the present invention. FIGS. 4(a), 4(b), 4(c), and 4(d) are views illustrating the spring contact according to the first embodiment of the present invention, wherein FIG. 4(a) is a front view of the spring contact manufactured by bending the plate pattern, FIG. 4(b) is a top plan view of the spring contact, FIG. 4(c) is a sectional view taken along line A-A of FIG. 4(a), and FIG. 4(d) is a sectional view taken along line B-B of FIG. 4(b).

Referring to FIG. 3, the plate pattern 10' manufactured by blanking a metal plate includes: an upper head portion 12 provided with upper tips 11 protruding upward; an upper neck 13 extending downward from the upper head portion 12; a pair of upper shoulders 14 protruding bilaterally from an approximate lower end of the upper neck 13; an upper connection portion 15 extending downward from the upper neck 13, the upper connection portion 15 being adjacent to the pair of upper shoulders 14; a spring portion 16 extending in a zigzag pattern from the upper connection portion 15; a lower connection portion 17 extending from a lower end of the spring portion 16; a lower head portion 19 having a lower tip 20 at the lower end and extending downward from the lower connection portion 17; and a pair of lower shoulders 18 protruding bilaterally from the lower head portion 19.

The upper head portion 12 is approximately rectangular, and a plurality of upper tips 11 protrude upward therefrom and make contact with leads of an integrated circuit (IC).

The upper head portion 12 and the lower head portion 19 are bilaterally symmetrical on an imaginary central axis C. The spring portion 16 on the imaginary central axis C runs in a zigzag pattern having a predetermined pitch (P) and a predetermined width (W).

Figure 4:
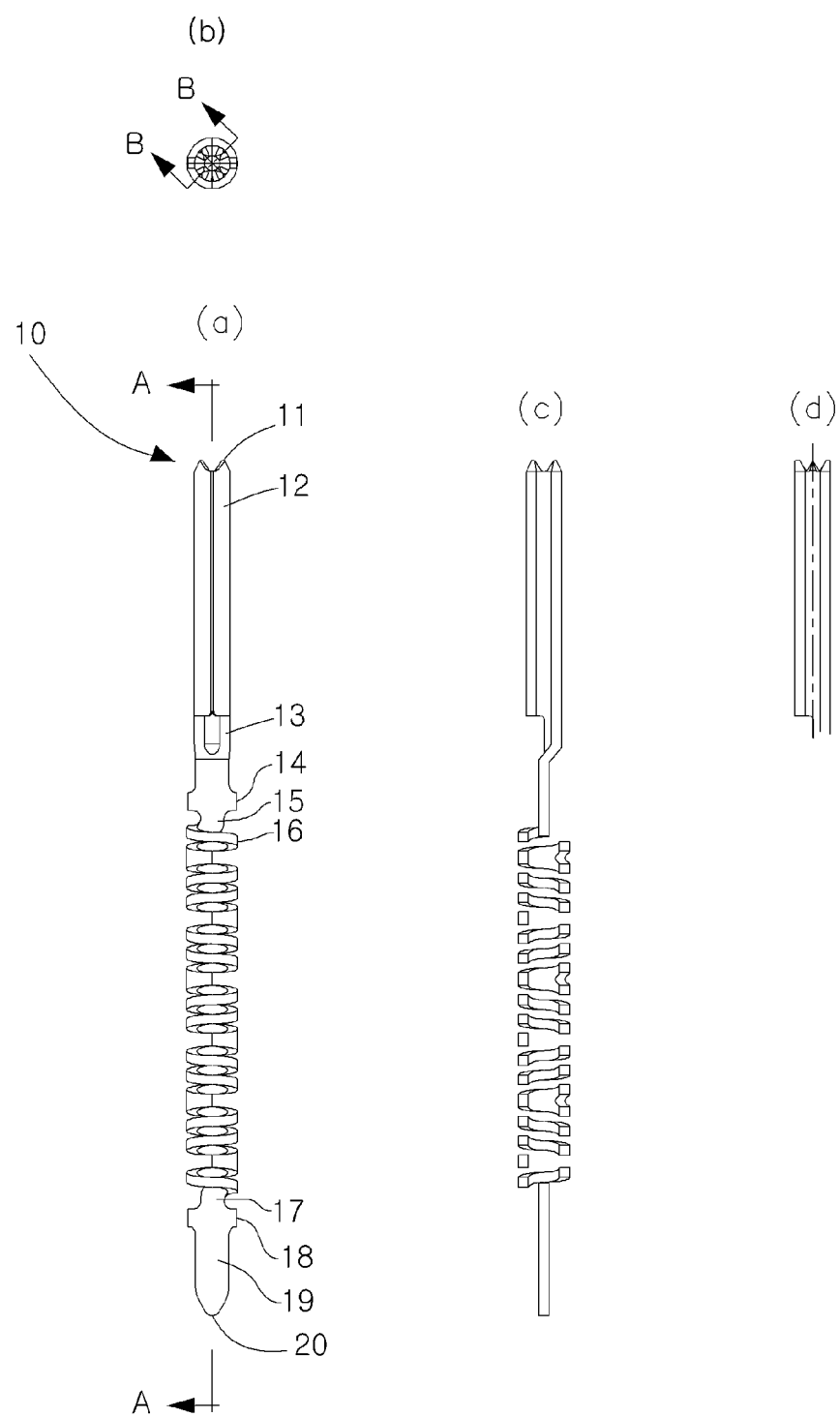
FIGS. 4(a), 4(b), 4(c) and 4(d) are views illustrating the spring contact according to the first embodiment of the present invention.

The upper head portion 12 and the spring portion 16 of the plate pattern are bent in a roll form, and thus an integrated spring contact 10 illustrated in FIG. 4 is provided.

It is preferred that the pair of upper shoulders 14 protruding bilaterally from the upper neck 13, and the pair of lower shoulders 18 protruding bilaterally from the lower head portion 19 are approximately the same as the spring portion 16 in diameter, or greater than the upper head portion 12 or the lower head portion 19 in diameter. When the spring contact is assembled in a socket device for testing ICs, the upper shoulders or the lower shoulders may function as an engaging member in the socket device.

In this embodiment, the upper shoulders and the lower shoulders are provided in the upper neck and the lower head portion, but are not limited thereto. As is understood more clearly in the following embodiments, a protrusion from each head portion or a connection portion (e.g., a neck) connecting each head portion with the spring portion may be formed within a range capable of supporting the spring portion.

The plurality of upper tips 11 of the spring contact 10 makes contact with leads of the IC, and the lower tip 20 is electrically connected to a printed circuit board (PCB). When the IC is pressed down, the spring portion 16 is lengthwise transformed and elastically compressed. Elasticity of the compressed spring portion 16 allows the upper tips 11 to apply pressure to and contact leads of the IC and the lower tip 20 to apply pressure to and contact the PCB. The subsequent stable electric contact enables testing of the IC.

Second Embodiment

Figure 5:
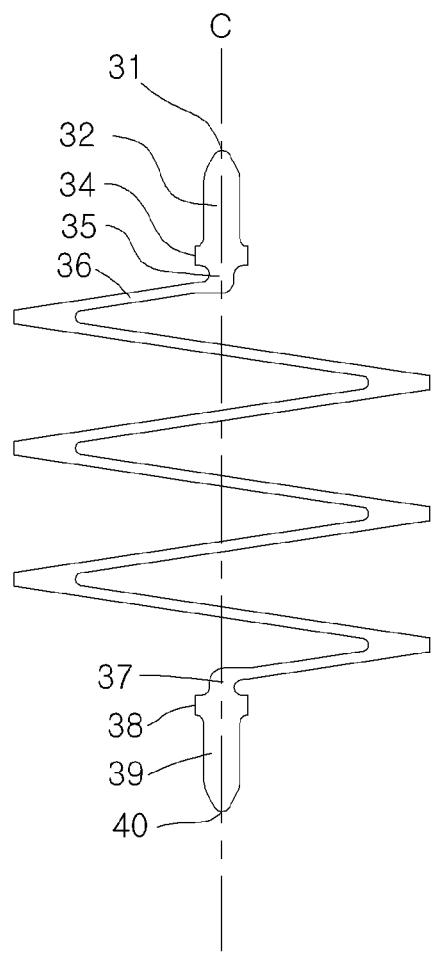
FIG. 5 is a view illustrating a plate pattern of a spring contact before bending according to a second embodiment of the present invention.
Figure 6:
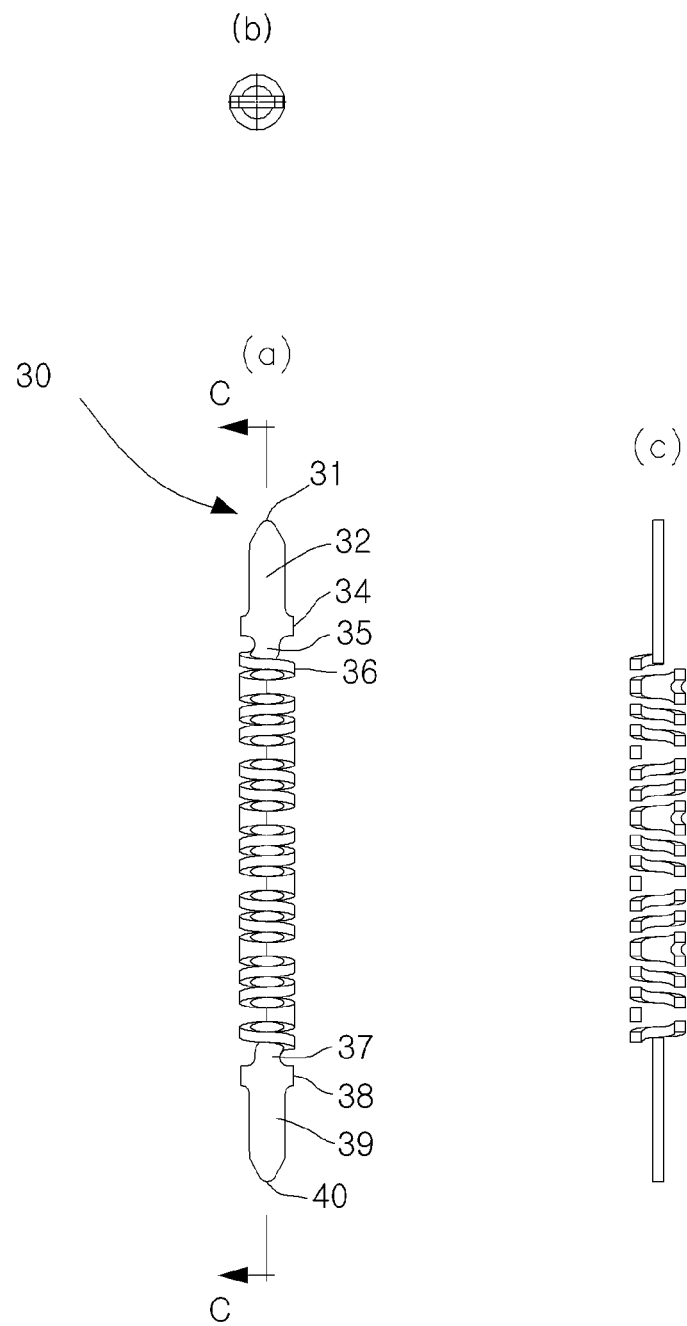
FIGS. 6(a), 6(b), and 6(c) are views illustrating the spring contact according to the second embodiment of the present invention.

FIG. 5 is a view illustrating a plate pattern of a spring contact before bending according to a second embodiment of the present invention. FIGS. 6(a), 6(b), and 6(c) are views illustrating the spring contact according to the second embodiment of the present invention, wherein FIG. 6(a) is a front view of the spring contact manufactured by bending the plate pattern, FIG. 6(b) is a top plan view of the spring contact, and FIG. 6(c) is a sectional view taken along line C-C of FIG. 6(a).

Referring to FIG. 5, the plate pattern 30' manufactured by blanking a metal plate includes: an upper head portion 32 provided with an upper tip 31 protruding upward; a pair of upper shoulders 34 protruding bilaterally from a lower end of the upper head portion 32; an upper connection portion 35 extending downward from the upper head portion 32, the upper connection portion 35 being adjacent to the pair of upper shoulders portion 34; a spring portion 36 extending in a zigzag pattern from the upper connection portion 35; a lower connection portion 37 extending from the lower end of the spring portion 36; a lower head portion 39 having a lower tip 40 formed at the lower end and extending downward from the lower connection portion 37; and a pair of lower shoulders 38 protruding bilaterally from an upper end of the lower head portion 39.

Unlike the first embodiment, the upper head portion 32 is provided with the single upward-protruding upper tip 31. The upper tip 31 contacts a lead of an IC.

The upper head portion 32 and the lower head portion 39 are bilaterally symmetrical on an imaginary central axis C. The spring portion 36 on the imaginary central axis C runs in a zigzag pattern having a constant pitch (P) and width (W).

Next, referring to FIGS. 6(a), 6(b), and 6(c), the spring portion 36 of the plate pattern is bent in a roll form, and thus an integrated spring contact 30 is provided.

As mentioned in the first embodiment, the position of the upper shoulders 34 and the lower shoulders 38 may be changed to various positions.

The upper tip 31 of the spring contact 30 comes in contact with the lead of the IC, and the lower tip 40 is electrically connected to the PCB. Elasticity caused by elastic transformation of the spring portion 36 enables a stable electrical contact between the lead of the IC and the PCB.

Third Embodiment

Figure 7:
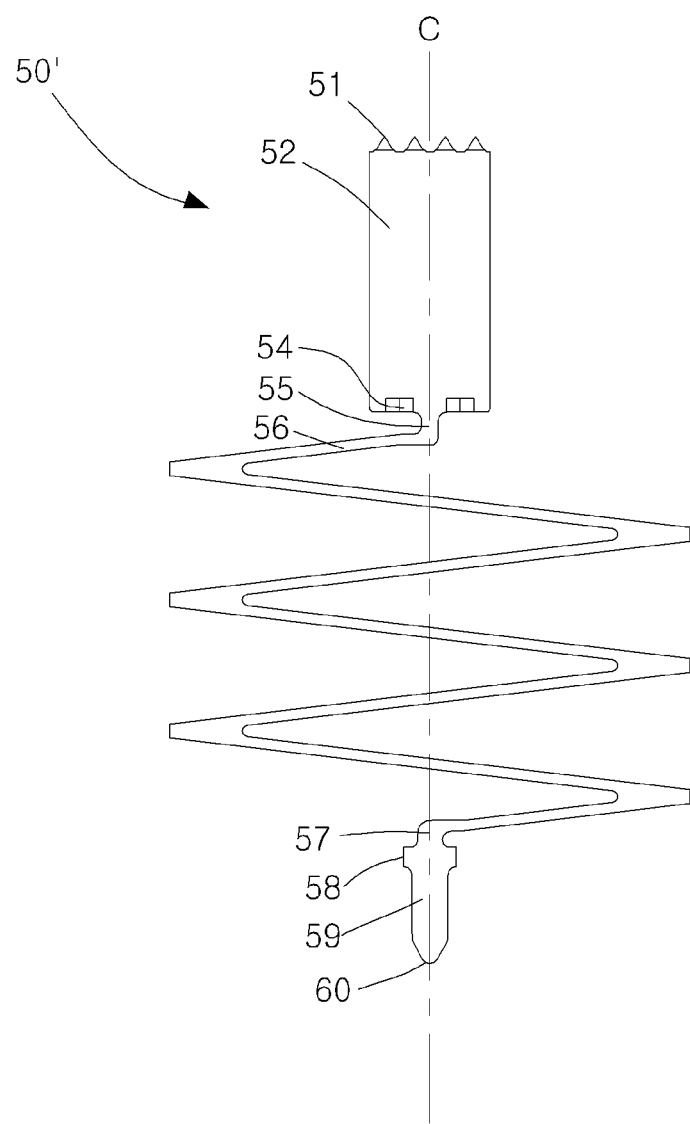
FIG. 7 is a view illustrating a plate pattern of a spring contact before bending according to a third embodiment of the present invention.
Figure 8:
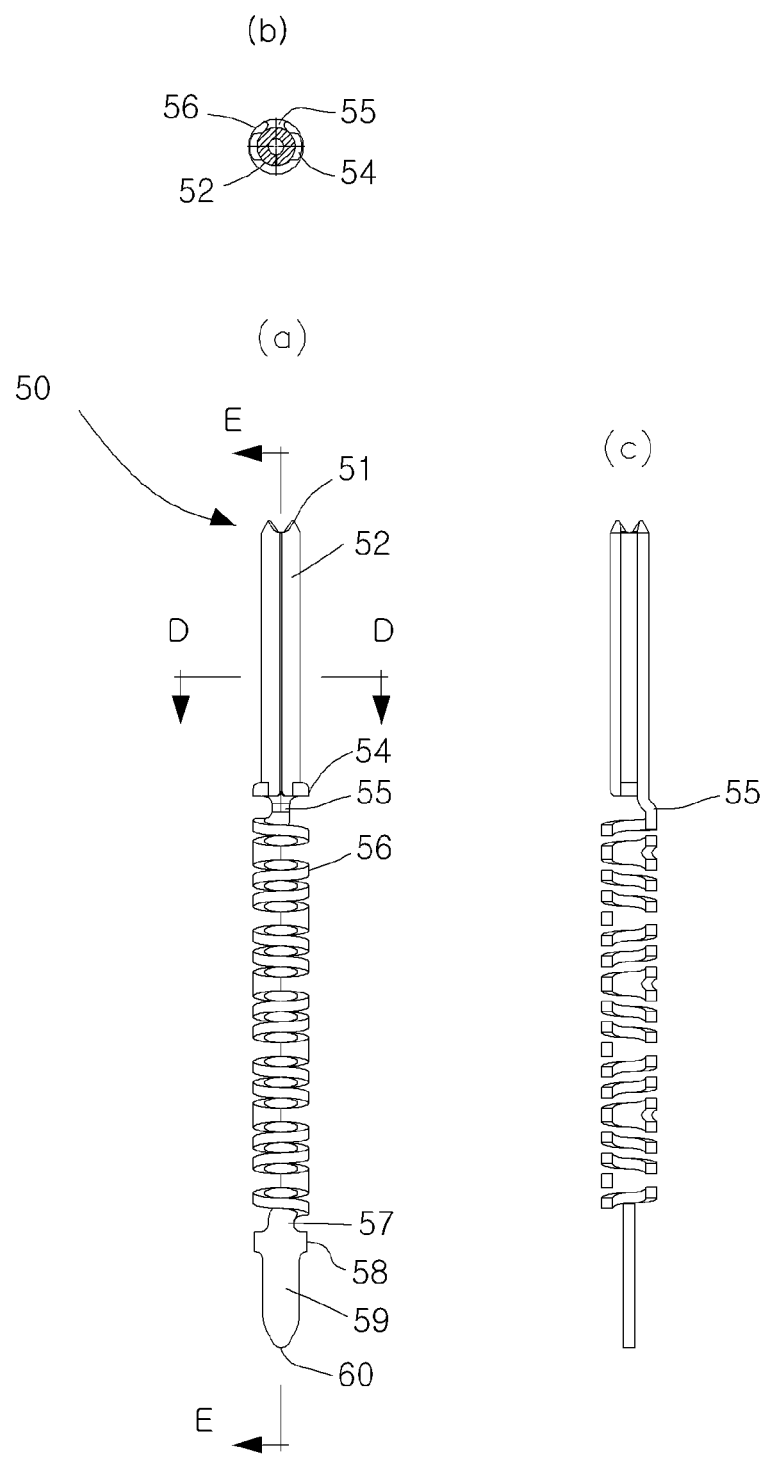
FIGS. 8(a), 8(b), and 8(c) are views illustrating the spring contact according to the third embodiment of the present invention.

FIG. 7 is a view illustrating a plate pattern of a spring contact before bending according to a third embodiment of the present invention. FIGS. 8(a), 8(b), and 8(c) are views illustrating the spring contact according to a third embodiment of the present invention, wherein FIG. 8(a) is a front view of the spring contact manufactured by bending the plate pattern, FIG. 8(b) is a top plan view of the spring contact, and FIG. 8(c) is a sectional view taken along line D-D of FIG. 8(a).

As illustrated in FIG. 7, the plate pattern 50' manufactured by blanking a metal plate includes: an upper head portion 52 provided with upward-protruding upper tips 51; a pair of upper shoulders 54 protruding upward from a lower end of the upper head portion 52; an upper connection portion 55 extending downward from the upper head portion 52; a spring portion 56 extending in a zigzag pattern from the upper connection portion 55; a lower connection portion 57 extending from the lower end of the spring portion 56; a lower head portion 59 having a lower tip 60 extending downward from the lower connection portion 57; and a pair of lower shoulders 58 protruding bilaterally from an upper end of the lower head portion 59.

The upper head portion 52 is approximately rectangular, and the plurality of upper tips 51 protrudes upward therefrom and come in contacts with leads of an IC.

The upper head portion 52 and the lower head portion 59 are bilaterally symmetrical on an imaginary central axis C. The spring portion 56 on the imaginary central axis C runs in a zigzag pattern having a constant pitch (P) and the width (W).

Next, referring to FIGS. 8(a), 8(b), and 8(c), the upper head portion 52 and the spring portion 56 of the plate pattern are bent in a roll form, and thus an integrated spring contact 50 is provided.

The upper tips 51 of the spring contact 50 come in contact with leads of the IC, and the lower tip 60 is electrically connected to a PCB. Elasticity caused by elastic transformation of the spring portion 56 enables a stable electrical contact between the lead of the IC and the PCB.

Fourth Embodiment

Figure 9:
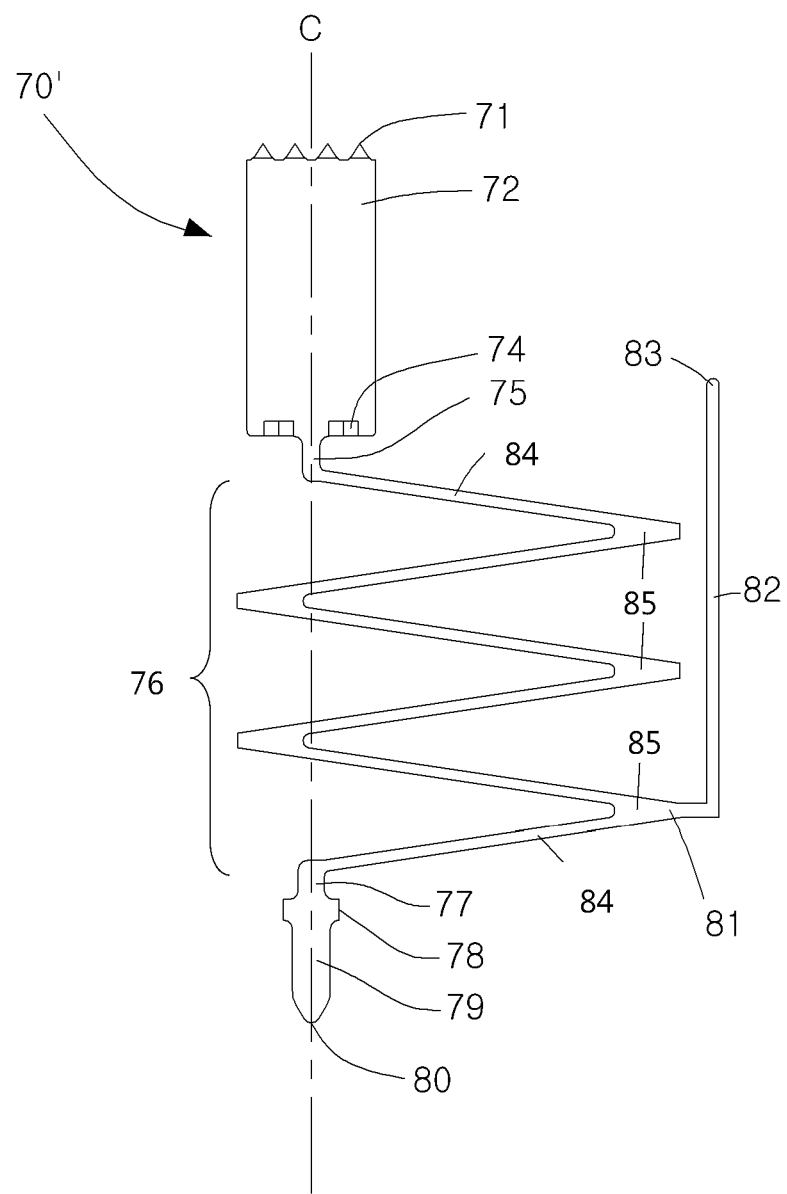
FIG. 9 is a view illustrating a plate pattern of a spring contact before bending according to a fourth embodiment of the present invention.
Figure 10:
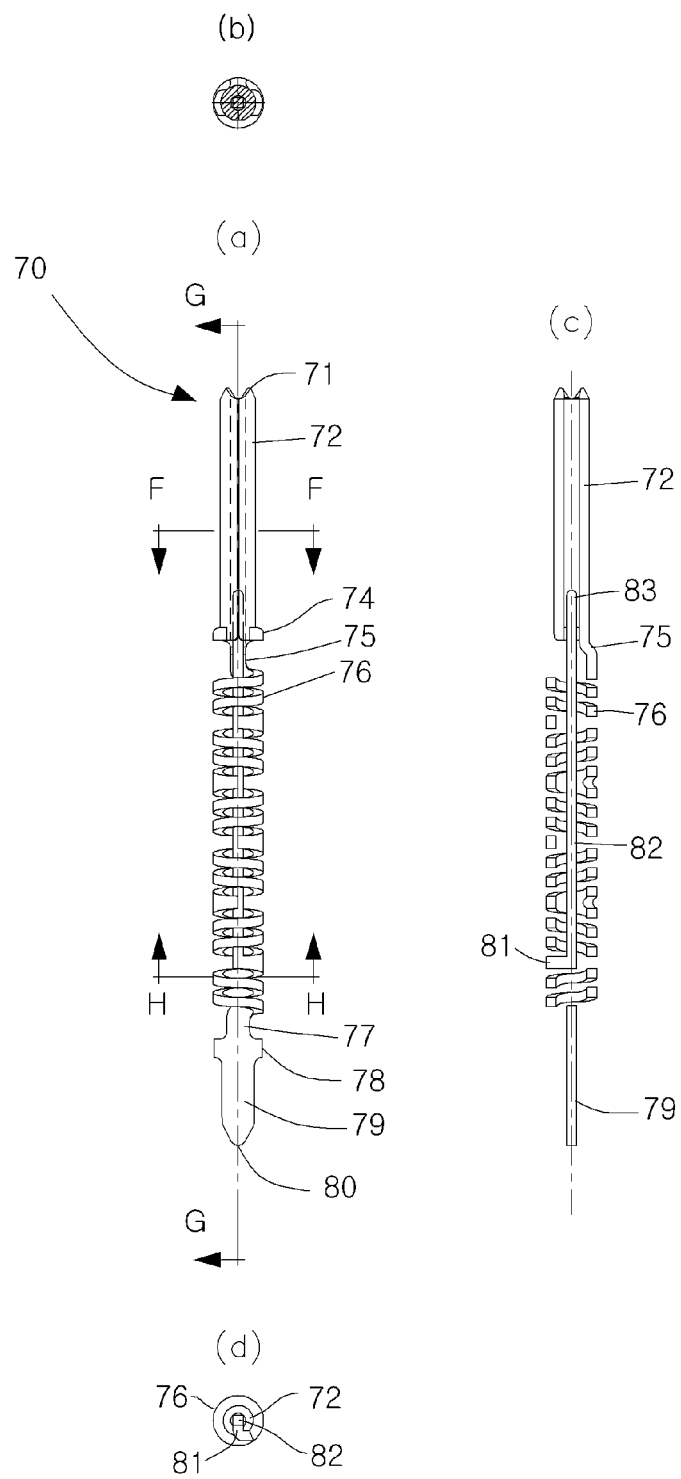
FIGS. 10(a), 10(b), 10(c), and 10(d) are views illustrating the spring contact according to the fourth embodiment of the present invention.
Figure 11:
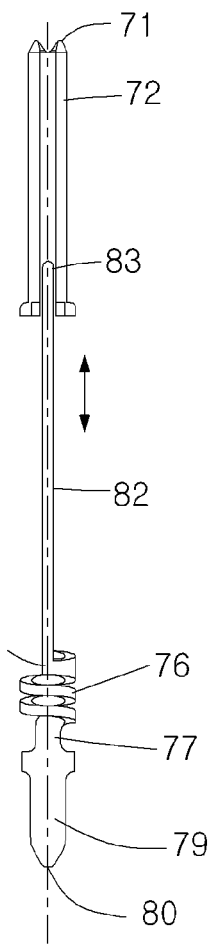
FIG. 11 is a view illustrating a conductive path of the spring contact according to the fourth embodiment of the present invention.

FIG. 9 is a view illustrating a plate pattern of a spring contact before bending according to a fourth embodiment of the present invention. FIGS. 10(a), 10(b), 10(c), and 10(d) are views illustrating the spring contact according to the fourth embodiment of the present invention, wherein FIG. 10(a) is a front view of the spring contact manufactured by bending the plate pattern, FIG. 10(b) is a sectional view taken along line F-F of FIG. 10(a), FIG. 10(c) is a sectional view taken along line G-G of FIG. 10(a), and FIG. 10(d) is a sectional view taken along line H-H of FIG. 10(a). FIG. 11 is a view for illustrating a conductive path of the spring contact according to the fourth embodiment of the present invention.

As illustrated in FIG. 9, the spring contact plate pattern 70' manufactured by blanking a metal plate includes: an upper head portion 72 provided with a plurality of upper tips 71 protruding upward; a pair of upper shoulders 74 protruding from a lower end of the upper head portion 72; an upper connection portion 75 extending downward from the upper head portion 72, the upper connection portion 75 being adjacent to the pair of upper shoulders 74; a spring portion 76 extending in a zigzag pattern from the upper connection portion 75; a lower connection portion 77 extending from the lower end of the spring portion 76; a lower head portion 79 having a lower tip 80 formed at the lower end and extending downward from the lower connection portion 77; a pair of lower shoulders 78 protruding bilaterally from the lower head portion 79; a horizontal connection portion 81 horizontally extending from a bent joint of the spring portion 76; and a core 82 extending in a leaner strip shape and vertically from the distal end of the horizontal connection portion 81 to the upper head portion 72.

The upper head portion 72 is approximately rectangular, and the plurality of upper tips 71 protrudes upward therefrom and comes in contact with leads of an IC.

The upper head portion 72 and the lower head portion 79 are bilaterally symmetrical on an imaginary central axis C. Preferably, the spring portion 76 runs in a zigzag pattern biased with respect to the imaginary central axis C, the zigzag pattern having a constant pitch (P) and width (W). The spring portion 76 includes straight portions 84 having a straight-line shape and bent joints 85 at which two straight portions 84 are connected with each other with an acute angle.

The horizontal connection portion 81 connected to the core 82 is horizontally extended from one of a plurality of bent joints of the spring portion 76. Preferably, the core 82 is provided by being horizontally extended from a bent joint at the lowest end of the spring portion 76.

When the core 82 is extended at least to the lowest end of the upper head portion 72 and bent, a contact end 83 at an upper end of the core 82 electrically makes contact with a rolled inner surface of the upper head portion 72, resulting in vertical movements of the core 82.

When the spring portion 76 is cylindrically bent, the core 82 is located at the center of the cylindrical spring portion 76 with the core 82 spaced from an inner surface of the spring portion 76. The contact end 83 makes contact with the inner surface of the upper head portion 72.

Though in the present embodiment, the core 82 and the contact end 83 are described to be separate from each other, the core 82 and the contact end 83 may be provided by a single linear strip. The portion at which the distal end of the linear strip makes contact with the upper head portion 72 is referred to as the contact end, and the rest of the linear strip is referred to as the core.

Referring to FIGS. 10(a) to 10(d), the upper head portion 72 and the spring portion 76 of the plate pattern are bent in a roll form and thus an integrated spring contact 70 is provided.

The core 82 is inside the spring portion 76 formed cylindrically with the core 82 spaced from the inner surface of the spring portion 76. The contact end 83 makes contact with the inner surface of the upper head portion 72.

In the spring contact 70, the plurality of upper tips 71 make contact with leads of an IC, and the lower tip 80 is electrically connected to the PCB. When the IC is pressed down from above, the spring portion 76 is lengthwise transformed and elastically compressed. Elasticity of the compressed spring portion 76 allows the upper tips 71 to apply pressure to and make contact with leads of the IC, and the elasticity allows the lower tip 80 to apply pressure to and make contact with the PCB. The subsequent stable electric contact enables testing of the IC.

FIG. 11 is a view for illustrating a conductive path of the spring contact according to the fourth embodiment of the present invention.

The conductive path between the upper tips 71 contacting the leads of the IC and the lower tip 80 contacting the PCB may have a first conductive path of the spring portion 76 and a second conductive path composed of the core 82 and the contact end 83.

Since the first conductive path is formed in a zigzag pattern while the second conductive path is formed in a strip pattern shorter than the first conductive path, electric signals running between the upper tips 71 and the lower tip 80 run a shorter distance through the second conductive path than the first conductive path.

Accordingly, the spring contact according to the fourth embodiment of the present invention transmits electric signals through the core 82 of linear strip and the contact end 83. Since elasticity needed for a reliable electrical contact may be provided by the spring portion 76, the spring contact has the following strong points: it is easy to be made into an optimized design that minimizes current resistance by minimizing the conductive path of the spring contact, and it is easy to ensure elasticity required to operate the spring contact.

Fifth Embodiment

Figure 12:
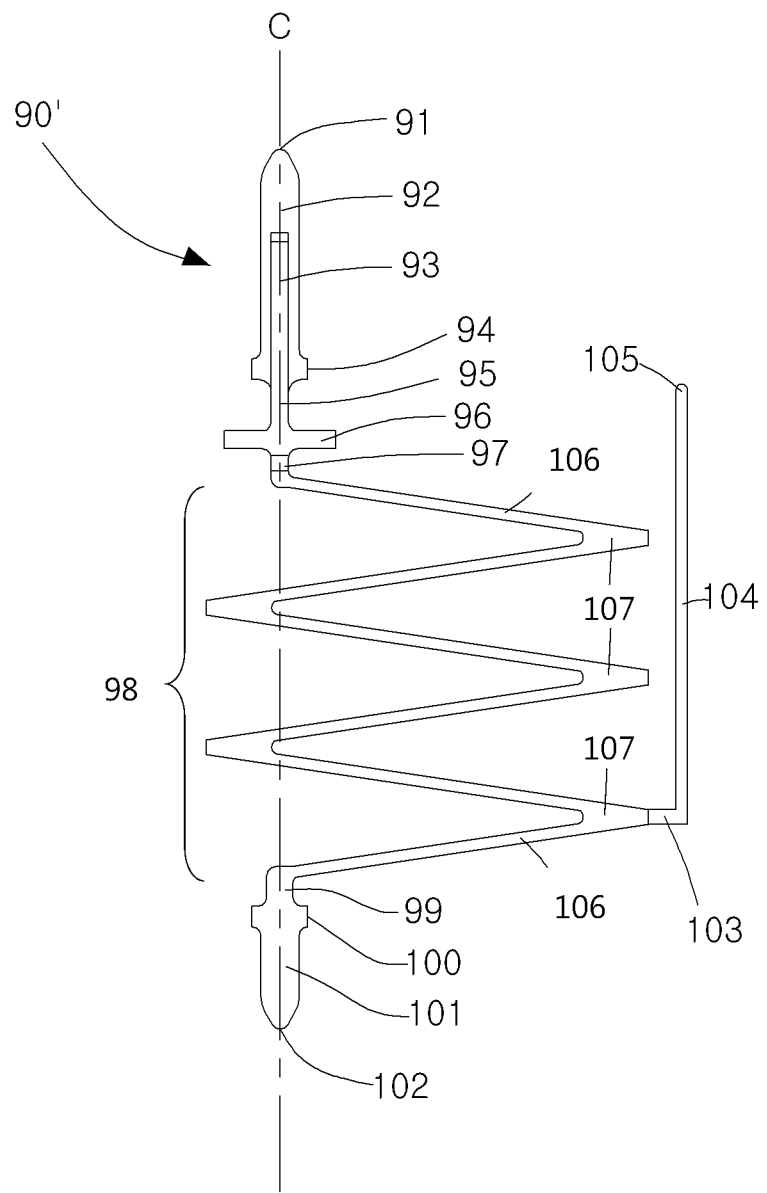
FIG. 12 is a view illustrating a plate pattern of a spring contact before bending according to a fifth embodiment of the present invention.
Figure 13:
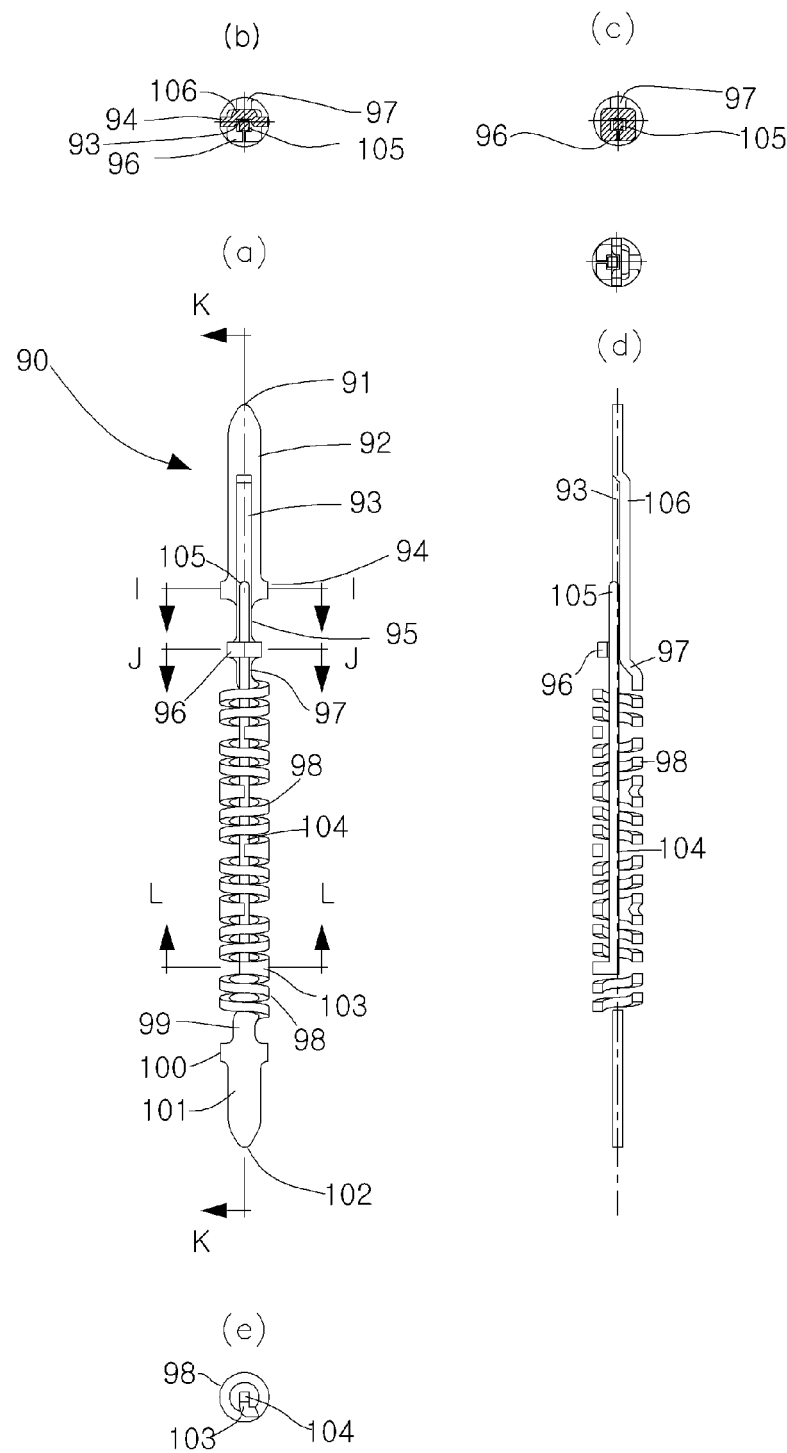
FIGS. 13(a), 13(b), 13(c), 13(d), and 13(e) are views illustrating the spring contact according to the fifth embodiment of the present invention.
Figure 14:
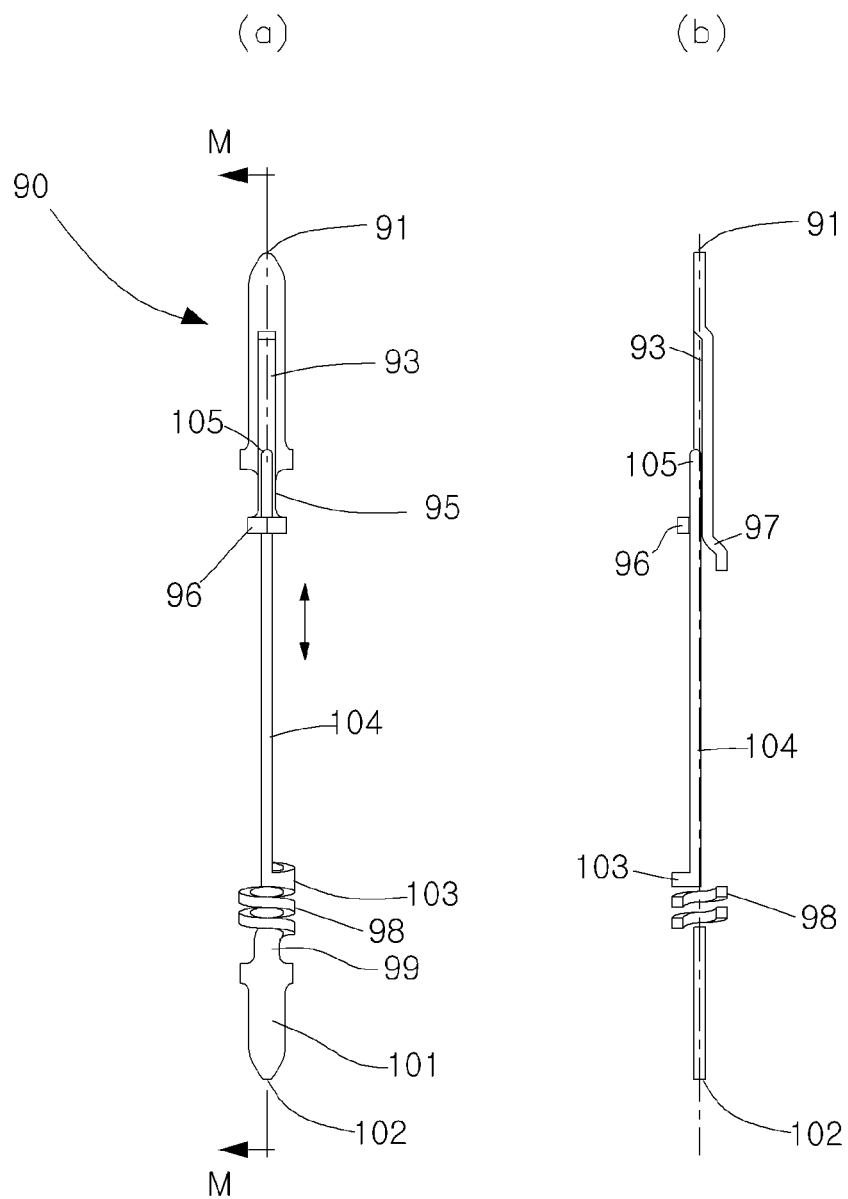
FIGS. 14(a) and 14(b) are views illustrating a conductive path of the spring contact according to the fifth embodiment of the present invention.
Figure 15:
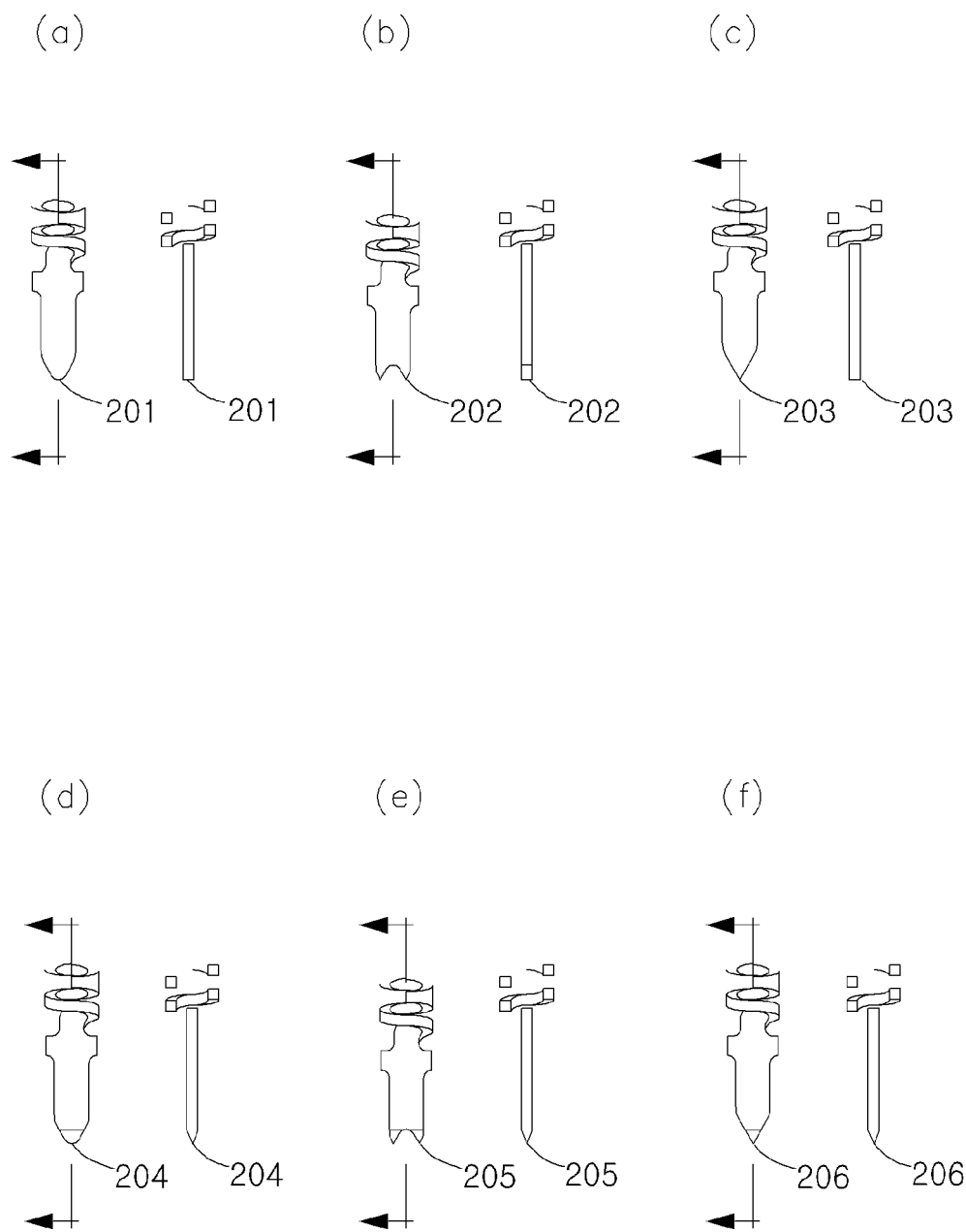
FIGS. 15(a) to 15(f) are views illustrating a variety of modifications of a lower head portion of the spring contact according to the present invention.

FIG. 12 is a view illustrating a plate pattern of a spring contact before bending according to a fifth embodiment of the present invention. FIGS. 13(a), 13(b), 13(c), 13(d), and 13(e) are views illustrating a bent spring contact according to the fifth embodiment of the present invention, wherein FIG. 13(a) is a front view of the spring contact manufactured by bending the plate pattern, FIG. 13(b) is a sectional view taken along line I-I of FIG. 13(a), FIG. 13(c) is a sectional view taken along line J-J of FIG. 13(a), FIG. 13(d) is a sectional view taken along line K-K of FIG. 13(a), and FIG. 13(e) is a sectional view taken along line L-L of FIG. 13(a). FIGS. 14(a) and 14(b) are views for illustrating a conductive path of the spring contact according to the fifth embodiment of the present invention.

Referring to FIG. 12, a spring contact plate pattern 90' manufactured by blanking a metal plate includes: an upper tip 91 formed upward; an upper head portion 92 provided with a contact groove 93 with predetermined depth and width; a pair of upper shoulders 94 protruding from a lower end of the upper head portion 92; a neck 95 being adjacent to the upper shoulders 94, the neck 95 extending downward in connection with the contact groove 93 of the upper head portion 92; a pair of rings 96 respectively protruding bilaterally from the neck 95; an upper connection portion 97 extending downward from the lower end of the neck 95; a spring portion 98 extending in a zigzag pattern downward from the upper connection portion 97; a lower head portion 101 having a lower tip 102 formed at the lowest end and extending downward from a lower connection portion 99 extending from the lower end of the spring portion 98; a pair of lower shoulders 100 protruding bilaterally from an upper end of the lower head portion 101; a horizontal connection portion 103 horizontally extending from a bent joint of the spring portion 98; and a core 104 extending in a linear strip shape and vertically from a distal end of the horizontal connection portion 103 to the upper head portion 92.

The upper head portion 92 and the lower head portion 101 are bilaterally symmetrical on an imaginary central axis C. Preferably, the spring portion 98 runs in a zigzag pattern biased with respect to the imaginary central axis C, the zigzag pattern having a constant pitch and width. The spring portion 98 includes straight portions 106 having a straight-line shape and bent joints 107 at which two straight portions 106 are connected with each other with an acute angle.

The horizontal connection portion 103 connected to the core 104 horizontally extends from one of a plurality of bent joints of the spring portion 98. Preferably, when a horizontal extension is made from a bent joint at the lowest end of the spring portion 98, the core 104 is provided.

Preferably, the core 104 is extended at least to the lowest end of the upper head portion 92. After the spring portion 98 is cylindrically bent, the core 104 is located at the center of the cylindrical spring portion 98. A contact end 105 at an upper end of the core 104 comes in electrical contact with the upper head portion 92, so the core 104 moves vertically. More preferably, the contact end 105 is properly positioned in the contact groove 93 of the upper head portion 92, and the core 104 moves vertically along the contact groove 93.

As mentioned in the fourth embodiment, it should be appreciated that the core 104 and the contact end 105 are not necessarily required to be separate from each other, and the core 104 and the contact end 105 may be provided by a single strip.

After being bent, the rings 96 respectively protruding on both sides of the neck 95 wrap the core 104 in a rolled form, guiding the direction of vertical movements of the core 104.

The rings 96 of this fifth embodiment are illustrated to be provided in a pair respectively protruding on both sides of the neck 95. However, the rings 96 may be provided long enough so that the ring 96 protrudes only from either of both sides of the neck 95 and fully wrap the core 104.

Referring to FIGS. 13(a) to 13(e), the spring portion 98 and the rings 96 of the plate pattern are bent in a rolled form, and thus an integrated spring contact 90 is provided.

The core 104 is located in the spring portion 98 with the core 104 spaced from an inner surface of the cylindrical spring portion 98. The contact end 105 makes contact with the upper head portion 92 when the contact end 105 is properly inserted in the contact groove 93 of the upper head portion 92.

After being bent, the rings 96 wrap the core 104, guiding vertical movements of the core 104.

A plurality of the upper tips 91 of the spring contact 90 makes contact with leads of an IC, and the lower tip 102 is electrically connected to a PCB. When the IC is pressed down from above, the spring portion 98 is lengthwise transformed and elastically compressed. Elasticity of the compressed spring portion 98 allows the upper tips 91 to apply pressure to and contact leads of the IC, and the elasticity allows the lower tip 102 to apply pressure to and make contact with the PCB. The subsequent stable electric contact enables testing of the IC.

FIGS. 14(a) and 14(b) are views for illustrating a conductive path of the spring contact according to a fifth embodiment of the present invention, in which FIG. 14(a) is a front view of the spring contact and FIG. 14(b) is a sectional view taken along line M-M.

As illustrated in the fourth embodiment above, in the spring contact according to the fifth embodiment of the present invention, the conductive path between the upper tips 91 contacting leads of the IC and the lower tip 102 contacting the PCB may include a first conductive path of the spring portion 98 and a second conductive path composed of the core 104 and the contact end 105. A conductive path runs along the second conductive path, which is short in length, thus minimizing current resistance.

FIGS. 15(a) to 15(f) are views illustrating a variety of variations of the lower head portion in the spring contact according to the present invention, wherein left views are front views and right views are sectional views thereof, respectively.

As illustrated in FIGS. 15(a) to 15(f), the lower head portion may have a U-shaped curved surface, a W-shaped curved surface, a V-shaped curved surface, or various types of lower tips 201 to 206 in a pointed form.

Figure 16:
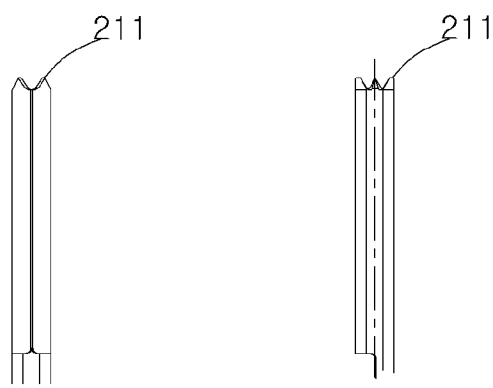
FIGS. 16(a), 16(b), and 16(c) are views illustrating a variety of modifications of an upper head portion of the spring contact according to the present invention.
Figure 16:
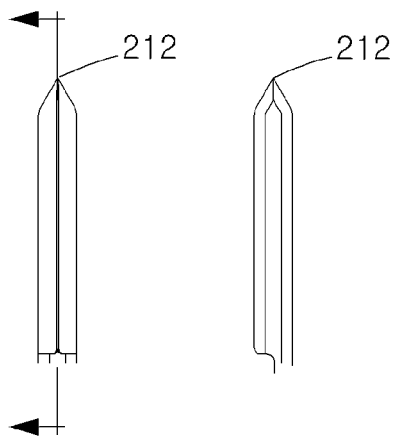
Figure 16:
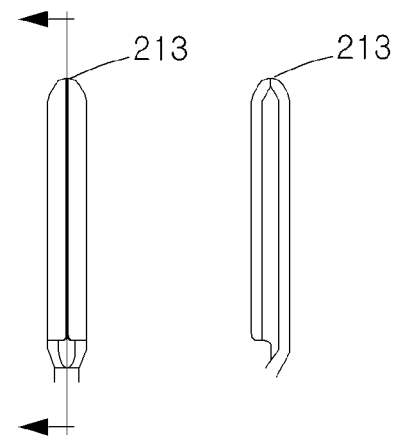

Next, FIGS. 16(a), 16(b), and 16(c) are views illustrating various variations of the upper head portion in the spring contact according to the present invention.

As illustrated in FIGS. 16(a), 16(b), and 16(c), the upper head portion can have a various types of upper tips, such as a crown-shaped tip 211, a cone-shaped tip 212, and a round-shaped tip 213.

The variations of the upper tips of each head portion illustrate only exemplary embodiments, so it should be appreciated that a variety of variations can be made depending on shape and characteristics of a contact object used.

Though the present invention is described by limited embodiments and drawings, the present invention is not limited to this, but may be modified or changed by those skilled in the art within the spirit of the art of the present invention and the range of the claims below.

What is claimed is:

1. A spring contact integrally formed by blanking and bending a metal plate member, the spring contact comprising:

an upper head portion having an upper tip protruding upward;

an upper connection portion connected to the upper head portion and extending downward from the upper head portion;

a spring portion connected to the upper connection portion and extending downward from the upper connection portion, the spring portion having a zigzag pattern that includes straight portions having a straight-line shape and bent joints at which two straight portions are connected with each other with an acute angle;

a lower connection portion connected to the spring portion and extending from a lower end of the spring portion;

a lower head portion directly connected to the lower connection portion and extending downward from the lower connection portion;

a lower tip disposed at a lower end of the lower head portion; and a core having a linear strip shape, wherein a first end of the core is directly connected to a lowest bent joint of the bent joints that is placed closest to the lower end of the spring portion, and the core extends from the lowest bent joint at least to a lowest end of the upper head portion so that a second end of the core is capable of contacting the upper head portion, and wherein a centerline of the upper head portion and a centerline of the lower head portion are on a same imaginary straight line, the spring portion has a pitch and a width that are constant, respectively, and the spring portion is formed to be biased with respect to the imaginary straight line such that all of the joint bents disposed in a first side of the zigzag pattern are placed closer to the imaginary straight line than the joint bents disposed in a second side of the zigzag pattern.

2. The spring contact of claim 1, wherein the core is spaced from a cylindrical inner surface of the spring portion.

3. The spring contact of claim 1, wherein when the spring contact is transformed to an integrated spring contact, the upper head portion is a hollow tube in shape, and the second end of the core remains in constant electrical contact with an inner surface of the upper head portion.

4. The spring contact of claim 1, wherein the upper head portion is provided with a contact groove into which the contact end is inserted and thus makes contact with the upper head portion.

5. The spring contact of claim 4, wherein the spring contact further comprises: a ring that protrudes from a neck connecting the upper head portion with the spring portion, the ring wrapping the contact end.

6. The spring contact of claim 1, wherein the upper head portion or the connection portion connecting the upper head portion with the spring portion further comprises a protruding upper shoulder.

7. The spring contact of claim 1, wherein the lower head portion or the connection portion connecting the lower head portion with the spring portion further comprises a protruding lower shoulder.

* * * * *